US007015685B2

(12) United States Patent
Nakayama

(10) Patent No.: US 7,015,685 B2
(45) Date of Patent: Mar. 21, 2006

(54) SEMICONDUCTOR TESTER

(75) Inventor: Hiroyasu Nakayama, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/850,050

(22) Filed: May 20, 2004

(65) Prior Publication Data

US 2005/0022088 A1    Jan. 27, 2005

Related U.S. Application Data

(63) Continuation of application No. PCT/JP02/12122, filed on Nov. 20, 2002.

(30) Foreign Application Priority Data

Nov. 20, 2001    (JP) .............................. 2001-354220

(51) Int. Cl.
*G01R 1/04* (2006.01)
*G01R 31/02* (2006.01)

(52) U.S. Cl. ................... 324/158.1; 324/755

(58) Field of Classification Search ............ 324/158.1, 324/755, 764, 765; 714/699, 700, 736, 738, 714/744
See application file for complete search history.

(56) References Cited

U.S. PATENT DOCUMENTS

| 5,212,443 A | 5/1993 | West et al. ............ 324/158 R |
| 5,477,139 A | 12/1995 | West et al. ............... 324/158.1 |
| 5,592,659 A | 1/1997 | Toyama et al. ............. 395/558 |
| 6,275,057 B1 * | 8/2001 | Takizawa ................. 324/158.1 |
| 6,522,126 B1 * | 2/2003 | Hanai et al. ............. 324/158.1 |
| 6,587,976 B1 * | 7/2003 | Yun et al. ................ 324/158.1 |

FOREIGN PATENT DOCUMENTS

JP             6-347519           12/1994

OTHER PUBLICATIONS

Patent Abstracts of Japan, publication No.: 06-347519, publication date Dec. 22, 1994.
International Search Report, application No.: PCT/JP02/12122, 2 pages.

* cited by examiner

*Primary Examiner*—Jermele Hollington
(74) *Attorney, Agent, or Firm*—Osha Liang LLP

(57) ABSTRACT

A semiconductor tester for testing a semiconductor device by generating pulses of different repetition periods to a DUT having ports of different periods (frequencies) without using plural timing memories holding timing sets. The semiconductor tester required to generate a timing edge pulse of a period M different from a test period N of the semiconductor tester comprises period converting means capable of generating a timing edge pulse of the period M different from the period N of the test rate without using timing set that the semiconductor tester has.

6 Claims, 14 Drawing Sheets

|  |  | DATAIN | CLKIN | DATAOUT |
|---|---|---|---|---|
| NOP | TS1 | a1 | 1 | b1 |
| NOP | TS2 | a2 | 1 | b2 |
| NOP | TS3 | a3 | 1 | b3 |
| NOP | TS4 | a4 | 1 | b4 |
| NOP | TS5 | a5 | 1 | b5 |
| NOP | TS6 | a6 | 1 | b6 |
| NOP | TS7 | a7 | 1 | b7 |
| NOP | TS8 | a7 | 0 | b8 |
| NOP | TS1 | a8 | 1 | b9 |
| NOP | TS2 | a9 | 1 | b10 |
| STOP | TS3 | a10 | 1 | b11 |

FIG. 5

PRIOR ART

|      |     | DATAIN | CLKIN | DATAOUT |
|------|-----|--------|-------|---------|
| NOP  | TS1 | a1     | 1     | b1      |
| NOP  | TS1 | a2     | 1     | b2      |
| NOP  | TS1 | a3     | 1     | b3      |
| NOP  | TS1 | a4     | 1     | b4      |
| NOP  | TS1 | a5     | 1     | b5      |
| NOP  | TS1 | a6     | 1     | b6      |
| NOP  | TS1 | a7     | 1     | b7      |
| NOP  | TS1 | a7     | 0     | b8      |
| NOP  | TS1 | a8     | 1     | b9      |
| NOP  | TS1 | a9     | 1     | b10     |
| STOP | TS1 | a10    | 1     | b11     |

SAME TS NUMBER FOR ALL

*FIG. 10*

SEMICONDUCTOR TESTER

The present application is a continuation application of PCT/JP02/12122 filed on Nov. 20, 2002 which claims priority from Japanese patent application No. 2001-354220 filed on Nov. 20, 2001, the entire contents of which are incorporated herein by reference for all purposes.

BACKGROUND OF THE INVENTION

1. Field of the Invention

The present invention relates to a semiconductor tester for testing a device under test (DUT) with a plurality of ports whose periods (frequencies) are different. More particularly, the present invention relates to a semiconductor tester capable of generating a test pattern by which a DUT with a plurality of ports whose periods are different can be tested without a plurality of timing memories for storing finite timing sets. In addition, the present application claims the benefit of, and priority to, Japanese patent application No. 2001-354220 filed on Nov. 20, 2001, the entire contents of which are incorporated herein by reference for all purposes.

2. Related Art

FIG. 1 shows the schematic configuration of a semiconductor tester. The main configuration elements include a timing generator TG, a pattern generator PG, a waveform formatter FC, a pin electronics PE, and a logic comparator DC. The pin electronics PE includes a driver DR, a comparator CP, etc. Here, since the semiconductor tester is publicly known and it is technically well known, the signals or configuration elements except the main elements related to this invention will not be described in detail.

FIG. 2 shows an example of a DUT which includes two ports required to have different periods (two kinds of periods). The DUT includes a FIFO memory and a built-in PLL oscillator therein. The built-in PLL oscillator generates a clock frequency, which results from receiving an input clock CLKIN and converting it at the rate of N/M, and supplies it to a retrieving clock input terminal RCLK of the FIFO.

FIG. 3 shows a timing chart where the DUT in FIG. 2 is tested with a test period (test rate) being set as a period N in accordance with a conventional semiconductor tester.

As shown in FIG. 3, since DATAIN and CLKIN operate with the period M if the test rate is cut out by the unit of the period N, it is inevitable to divide and attach different timing set signals (TS signals) TS1 to TS8 for each cycle. However, because of a simple period (least common multiple period P) in this case where the period M times 7 and the period N times 8 make one round, a circulation is completed with 8 of the TS signals TS1 to TS8. In a practical DUT test, however, various period conditions are required. The number of the timing sets to be used (number of TS) is required to be (the least common multiple period of the periods M and N)/the period N.

Meanwhile, the number of TS provided to the semiconductor tester is finite as many as 1024. In case of the condition which exceeds that number, there is a problem that the device test is difficult. Otherwise, it is necessary to increase the number of TS. The timing sets are provided in an LSI for each test channel. Besides, it is required to be changeable with the on-the-fly, and it is required to be capable of operating at a maximum test rate, e.g. 500 MHz. Accordingly, increasing the memory capacity of the timing sets up to two or four times the capacity causes a problem that the number of the test channels which can be mounted in an LSI decreases. Further, the increase of the memory capacity leads to a problem of high cost.

FIG. 4 shows a timing chart where a test pattern in response to the periods M and N is generated with timing sets provided in a practical semiconductor tester being applied. The test rate of the semiconductor tester fits into the period N of the DATAOUT side, so CLKIN and DATAIN of the period M is required to supply a pattern to be applied which has been delayed by a predetermined amount in order that timing edges should exist at predetermined positions respectively by sequentially changing the TS signals for each cycle using 8 TSs, i.e. TS1 to TS8.

FIG. 5 shows an example of the test pattern in response to the timing chart in FIG. 4. This is a test pattern cut out with the test rate being taken as the period N. Herein, "NOP" is a sequence instruction indicating to proceed to the next address in case of performing the pattern of that address, and "STOP" is an instruction to complete the generation of the pattern in case of performing the pattern of that address. TS1 to TS8 are the delay data to designate the delay amount from each start point of the period N for each cycle edge. Pluses are generated at the timing which has been delayed by a predetermined amount for each cycle on the basis of the TSs. Furthers All of them are stored in a pattern memory (not shown) inside the pattern generator PG.

FIG. 6 shows a block diagram of a timing generator TG, a waveform formatter FC, and a logic comparator DC in the conventional art, depicting one of tester channels. Further, the tester channels depend upon the system configuration, and hundreds or thousands of channels are provided.

TG related to this invention accesses a timing set memory TSM for storing delay information and supplies a plurality of edge pluses TDT which are the result of delaying timing pulses with variable delay means d22 by a predetermined amount in the corresponding cycle based on a timing set signal TTS which is the result of receiving a timing set signal PGTS that designates the timing set from PG shown in FIG. 1 via a test period generating unit 10. And it outputs a test rate clock TRATE indicating the test rate.

FC related to this invention includes a FIFO 42 and a formatting unit 44. The FIFO 42 receives a test pattern PAT1 from PG, stores it in a buffer with a rate clock RATECLK, and supplies FIFO output data 42s which is the result of retrieving the content stored in the FIFO at the timing of the test rate clock TRATE to the formatting unit 44.

The formatting unit 44 receives the output data 42s of the FIFO, and outputs a drive pulse DRP, which is the result of receiving a predetermined number of edge pulses TDT and formatting them into a predetermined waveform to be applied, to the DUT via the pin electronics.

DC related to this invention includes a FIFO 52 and a comparator 54. The FIFO 52 receives an expected value pattern PAT2 from PG, stores it in a buffer with the rate clock RATECLK, and supplies FIFO output data 52s which is the result of retrieving the content stored in the FIFO at the timing of the test rate clock TRATE to the comparator 54.

The comparator 54 receives the FIFO output data 52s, receives a plurality of edge pulses TDT as a strobe signal, and outputs a fail signal FL which is the result of judging the quality of a comparator signal CPD that is a response signal from the DUT under a predetermined comparison condition.

According to the conventional configuration in FIG. 6 as described above, it is necessary to apply a test pattern in FIG. 5 to the waveform of the timing chart shown in FIG. 4. Consequently, even in case of two kinds of periods and in a simple case that the least common multiple period P is 8, 8 numbers of TSs, i.e. TS1 to TS8 are consumed. In case of 3 kinds of periods, the least common multiple period P for the 3 kinds of periods becomes a larger value. If the least common multiple period P exceeds 1024, the test becomes impossible, and it is necessary to considerably increase the timing memory as much as two or four times. In this regard, the semiconductor tester of the conventional configuration has a practical problem which is not preferable.

SUMMARY OF THE INVENTION

Accordingly, it is an object of the present invention to provide a semiconductor tester for testing a semiconductor device by generating pulses (e.g. waveforms to be applied) of different repetition periods to a DUT having ports of different periods (frequencies) without using plural timing memories holding timing sets.

In addition, it is an object of the present invention to provide a semiconductor tester capable of easily generating pulses (e.g. waveforms to be applied) at the timing whose periods (frequencies) are different.

The first means for achieving the above objects will be shown.

In order to solve the above problems, a semiconductor tester required to generate a timing edge pulse of a different period H different from a period N which is a test period (test rate) of the semiconductor tester includes period converting means capable of generating the timing edge pulse whose different period M is different from the period N of the test rate without applying a plurality of timing sets provided in the semiconductor tester.

According to this invention, it is possible to realize a semiconductor tester for testing a semiconductor device by generating pulses (e.g. waveforms to be applied or strobe signals) of different repetition periods to a DUT having ports of different periods (frequencies) without using plural timing memories holding timing sets.

Next, the second means for achieving the above objects will be shown.

In order to solve the above problems, a semiconductor tester provided with a plurality of timing sets capable of giving a predetermined delay amount for each tester channel with reference timing being taken as a base point, where a test period (test rate) of the semiconductor tester is taken as the reference timing, and configured to generate a timing edge pulse delayed by a predetermined amount based on the timing sets includes period converting means capable of generating a timing edge pulse whose different period M is different from a period N which is a test rate of the semiconductor tester without applying the plurality of timing sets with regard to a tester channel for generation of the timing edge pulse.

Next, the third means for achieving the above objects will be shown.

In order to solve the above problems, a semiconductor tester provided with a plurality of timing sets capable of giving a predetermined delay amount for each tester channel with reference timing being taken as a base point, where a test period (test rate) of the semiconductor tester is taken as the reference timing, and configured to generate a timing edge pulse delayed by a predetermined amount based on the timing sets includes different period designating means capable of generating a timing edge pulse whose different period M is different from a period N, which is a test rate of the semiconductor tester, without depending upon a timing set signal PGTS to designate a timing set number generated from a pattern generator PG with regard to a tester channel for generation of the timing edge pulse and controlling designation of the different period M to be independent from outside.

Next, the fourth means for achieving the above objects will be shown.

The semiconductor tester includes a test period generating unit 10, wherein when the test period generating unit 10 generates a rate clock RATECLK of the period N which is to be the test period (test rate) of the semiconductor tester based on the timing set signal PGTS to designate the timing set number (TS number) generated from the pattern generator PG, the period conversion means receives the rate clock RATECLK of the period N, outputs a period conversion clock converted and generated with the different period M, and supplies the period conversion clock TRATECLK to a timing generator TG on a next stage of the tester channel.

Next, the fifth means for achieving the above objects will be shown.

The period conversion clock TRATECLK generates a clock of the different period M by receiving a delay amount of a period difference between the period N of the test rate and the different period M (M−N) and applying a predetermined delay for each clock of the test rate.

Next, the sixth means for achieving the above objects will be shown. Here, FIG. 8 shows the means for achieving the above objects related to this invention.

In an aspect of the period conversion means, it includes period difference accumulating means for generating data under different period (accumulated and held data 108s) which results from accumulatively adding a period difference between the period N of the test rate and the different period M (M−N), and different period clock converting means for outputting a period conversion clock TRATECLK which results from receiving the rate clock RATECLK of the period N and converting the rate clock RATECLK into the different period M by applying a delay amount in response to the data under different period.

Next, the seventh means for achieving the above objects will be shown. Here, FIG. 12 shows the means for achieving the above objects related to this invention.

When a timing generator TG of the tester channel includes a timing set memory TSM and variable delay means d22b therein, the period conversion means includes period difference accumulating means for generating data under different period (accumulated and held data 108s) by accumulatively adding a period difference between the period N of the test rate and the different period M (M−N), TS adding means (e.g. adder 124) for outputting addition delay data (edge pulse delay data 124s) which results from receiving TS delay data TSMd retrieved by selecting a TS number based on the timing set signal outputted from the timing set memory TSM and data under different period and adding the TS delay data and data under different period, and thinning means (e.g. clock gate 118) for outputting an thinning clock 118s where a clock of a cycle is removed when the data under different period, which results from receiving and accumulatively adding a rate clock RATECLK of the period N, matches with the different period M, and the variable delay means d22b generates an edge pulse which results from delaying the thinning clock 118s by a predetermined amount based on the addition delay data (edge pulse delay data 124s), outputs the edge pulse from the TG, and supplies the edge pulse TDT a waveform formatter FC provided on a next stage of the TG.

Next, the eighth means for achieving the above objects will be shown. Here, FIGS. 8 and 9 show the means for achieving the above objects related to this invention.

In an aspect of the period difference accumulating means, it includes a reference period register 110, a period differential register 102, an adder 104, a flip-flop 108, and a comparator/subtractor 112, where the reference period register 110 is a register for holding reference period data 110s of the different period M, the period differential register 102 is a register for period difference data 102s which is period difference (the different period M–the period N), the adder 104 is to output accumulated and added data 104s which is the result of receiving the period difference data 102s and the period difference data 112s accumulated and added and adding both of them, the flip-flop 108 is to supply accumulated and held data 108s which is the result of receiving the accumulated and added data 104s and latching and holding it with the rate clock RATECLK to the comparator/subtractor 112, and the comparator/subtractor 112 which functions as a comparator and subtractor receives the accumulated and held data 108s and the reference period data 110s, calculates the period difference data 112s less than the reference period data 110s and supplies it to the adder 104, while generating an thinning signal COMP which is the result of thinning the rate clock RATECLK by a predetermined amount and supplying it to the clock gate 118 when the accumulated and held data 108s is equal to or larger than the reference period data 110s.

Next, the ninth means for achieving the above objects will be shown.

In an aspect of the different period designating means, it sets and controls the delay data in response to the different period M to the period differential register 102 and the reference period register 110 from outside based on the control individually independent of the test pattern stored in the pattern generator PG.

Next, the tenth means for achieving the above objects will be shown. Here, FIGS. 8 and 9 show the means for achieving the above objects related to this invention.

In an aspect of the different period clock converting means, it includes a clock gate 118 and a period generating unit 120, where the clock gate 118 is to output the thinning clock 118s in which a clock of a cycle is removed when the accumulated and held data 108s matches with the different period M, during receiving the rate clock RAETECLK and supplying it to the period generating unit 120, and the period generating unit 120 is to output the period conversion clock TRATECLK which is the result of receiving the thinning clock 118s and converting it into the period M applied with the delay amount in response to the accumulated and held data 108s.

Next, the eleventh means for achieving the above objects will be shown. Here, FIG. 11 shows the means for achieving the above objects related to this invention.

In an aspect of the period difference accumulating means, it includes a period M register 103, a subtractor 105, an adder 104, a flip-flop 108, and a comparator/subtractor 112, where the period M register 103 is a register for holding the data of the different period M, the subtractor 105 is to receive the data of the different period M and the data of the period N which is the test rate and calculate the period difference data 102s which is the period difference of both of them (the different period M–the period N), the adder 104 is to output accumulated and added data 104s which is the result of receiving the period difference data 102s and the period difference data 112s accumulated and added and adding both of them, the flip-flop 108 is to supply accumulated and held data 108s which is the result of receiving the accumulated and added data 104s and latching and holding it with the rate clock RATECLK to the comparator/subtractor 112, and the comparator/subtractor 112 which functions as a comparator and subtractor receives the accumulated and held data 108s and the reference period data 110s, calculates the period difference data 112s less than the reference period data 110s and supplies it to the adder 104, while generating an thinning signal COMP which is the result of thinning the rate clock RATECLK by a predetermined amount and supplying it to the clock gate 118 when the accumulated and held data 108s is equal to or larger than the reference period data 110s.

Next, the twelfth means for achieving the above objects will be shown.

In an aspect of the different period clock converting means, it sets and controls the delay data in response to the different period M to the period M register 103 from outside based on the control individually independent of the test pattern stored in the pattern generator PG.

Next, the thirteenth means for achieving the above objects will be shown.

The different period designating means for setting and controlling from outside performs setting and controlling by applying a tester bus provided in the semiconductor tester while independent of the test pattern.

Next, the fourteenth means for achieving the above objects will be shown.

In an aspect of the period conversion means, it includes at least one tester channel.

The summary of the invention does not necessarily describe all necessary features of the present invention. The present invention may also be a sub-combination of the features described above.

BRIEF DESCRIPTION OF THE DRAWINGS

FIG. 5 shows an example of the test pattern in response to the timing chart in FIG. 4.

FIG. 10 shows an example of the test pattern generated with one TS number which is TS1 being applied.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

The present invention will hereafter be described referring to FIGS. 7, 8, 9, 10, 11, 12, 13 and 14. Further, elements in response to the conventional configuration are given the same symbols, and matters repeated will not be described.

Figure 7:
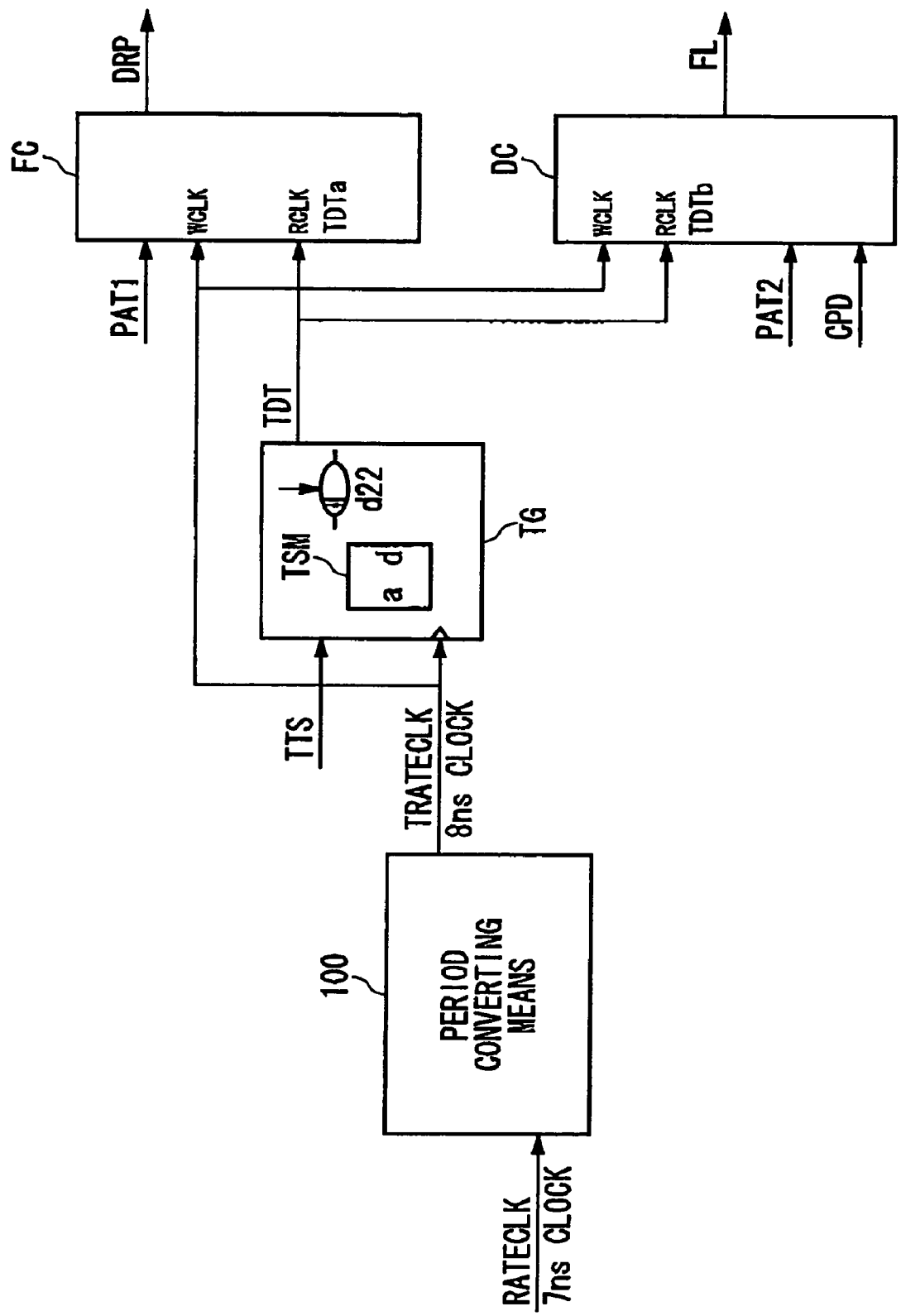
FIG. 7 shows a main block diagram where period converting means according to this invention is added and configured with regard to one of tester channels.

FIG. 7 shows a main block diagram where period converting means 100 according to this invention is configured to be added with regard to one of tester channels, and the other configuration elements, i.e. a timing generator TG, a waveform formatter FC, and a logic comparator DC are the same as those of the conventional art, so they will not be hereafter described. Here, this invention will be described with such specific exemplary values as the period M=8 ns and the period N=7 ns being applied. In addition, the test period (test rate) of the semiconductor apparatus is applied with the period of 7 ns.

Figure 3:
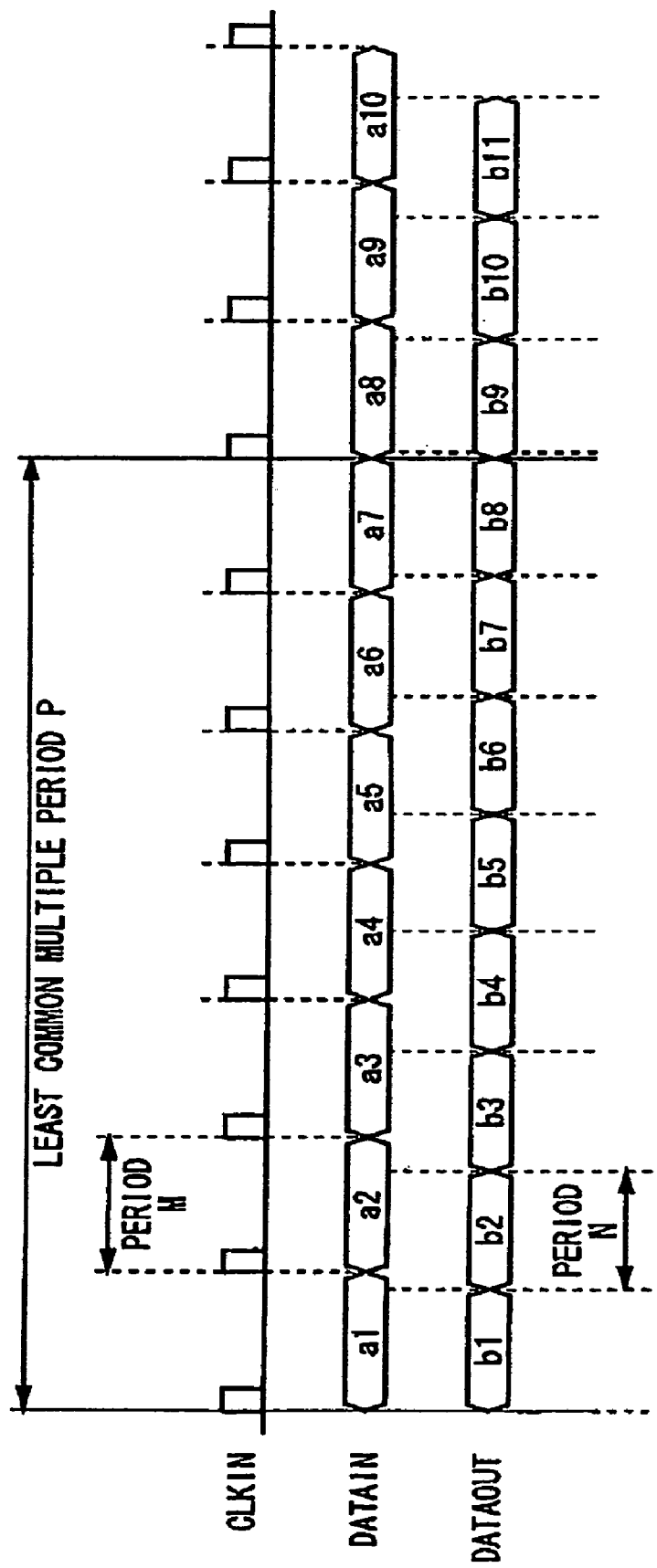
FIG. 3 shows a timing chart where the DUT in FIG. 2 is tested with a test period (test rate) being set as a period N in the prior art.
Figure 4:
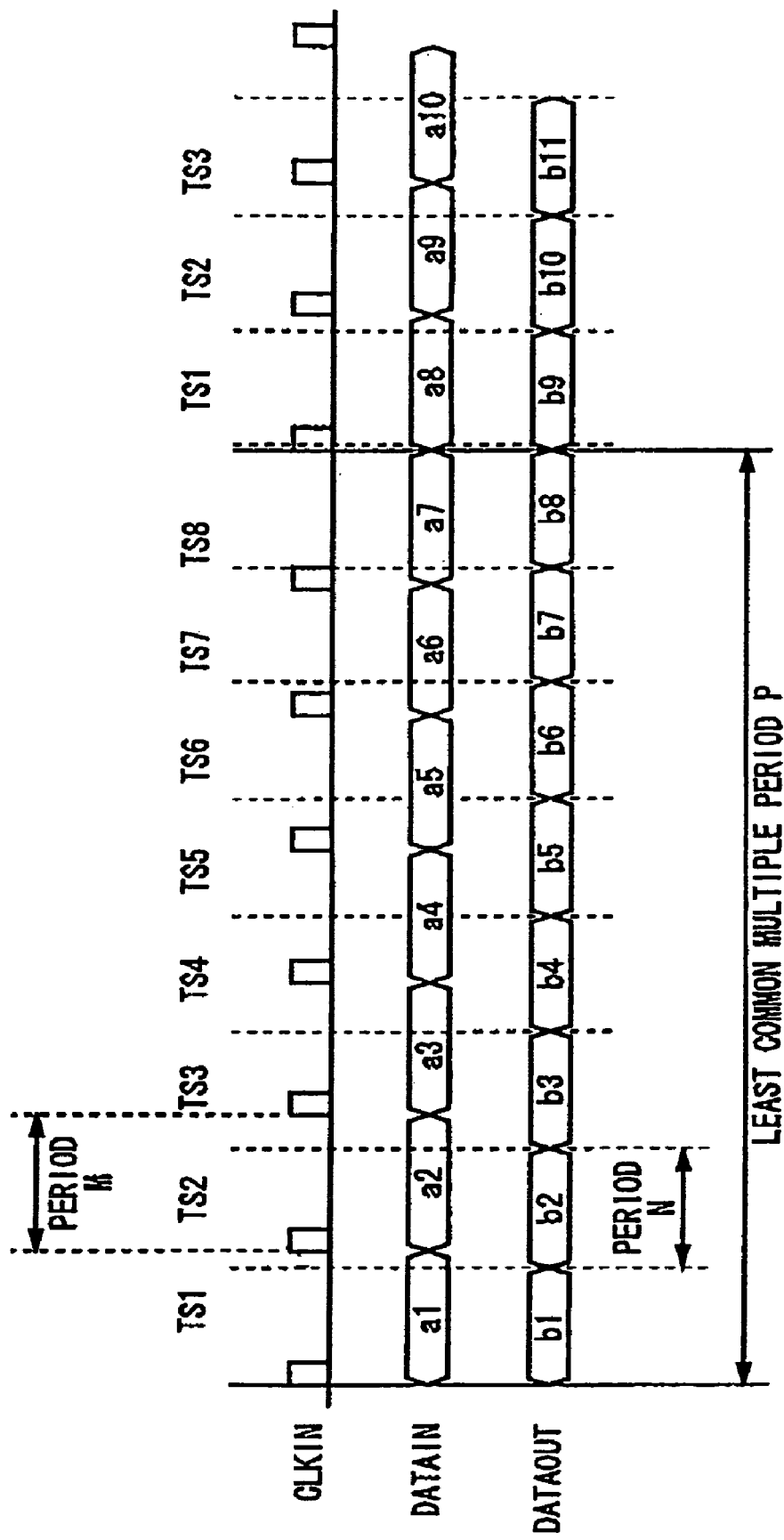
FIG. 4 shows a timing chart where a test pattern in response to the periods M and N is generated with timing sets provided in a practical semiconductor tester being applied.
Figure 6:
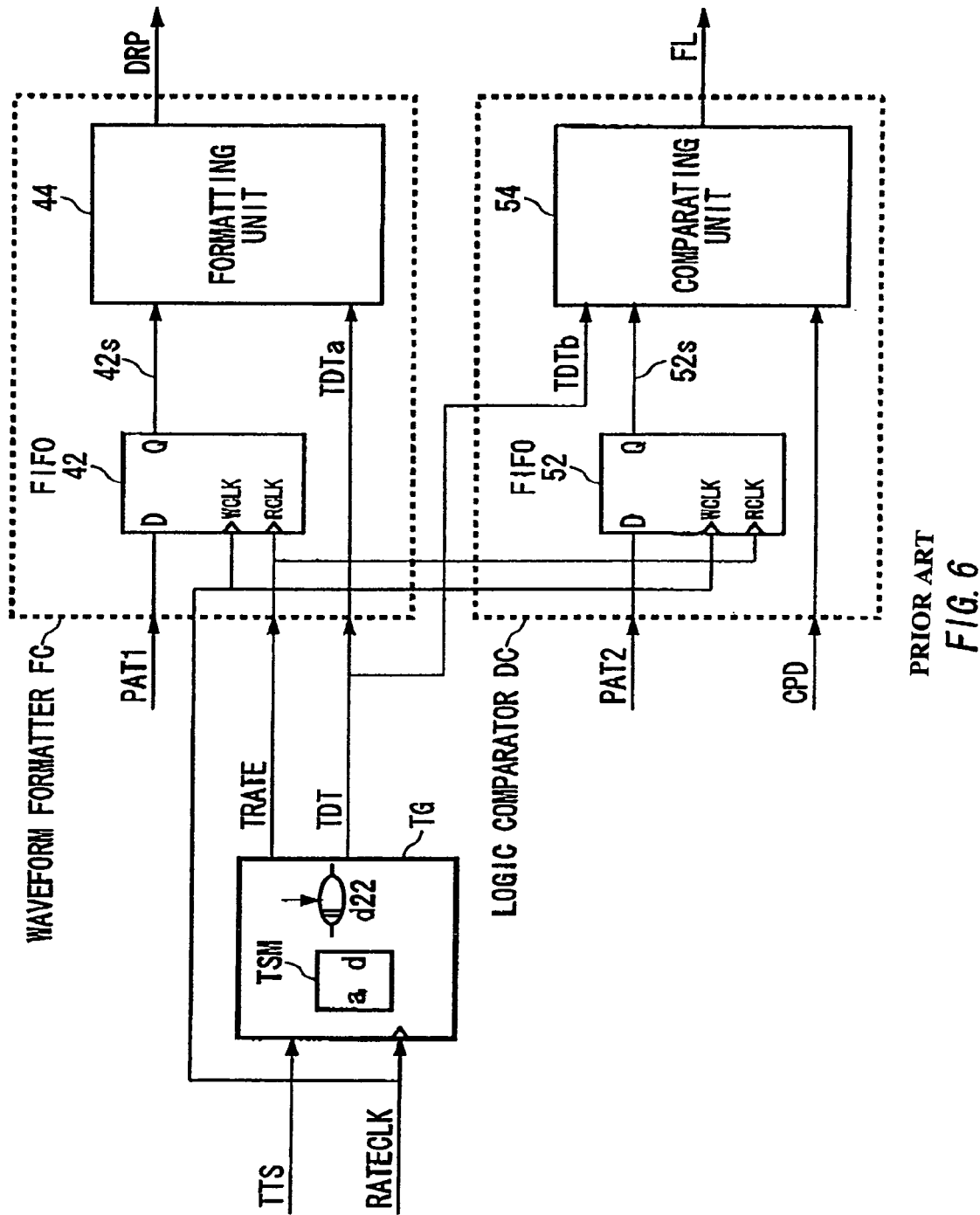
FIG. 6 shows a main configuration of a semiconductor tester capable of generating the test pattern depicting one of test channels.
Figure 8:
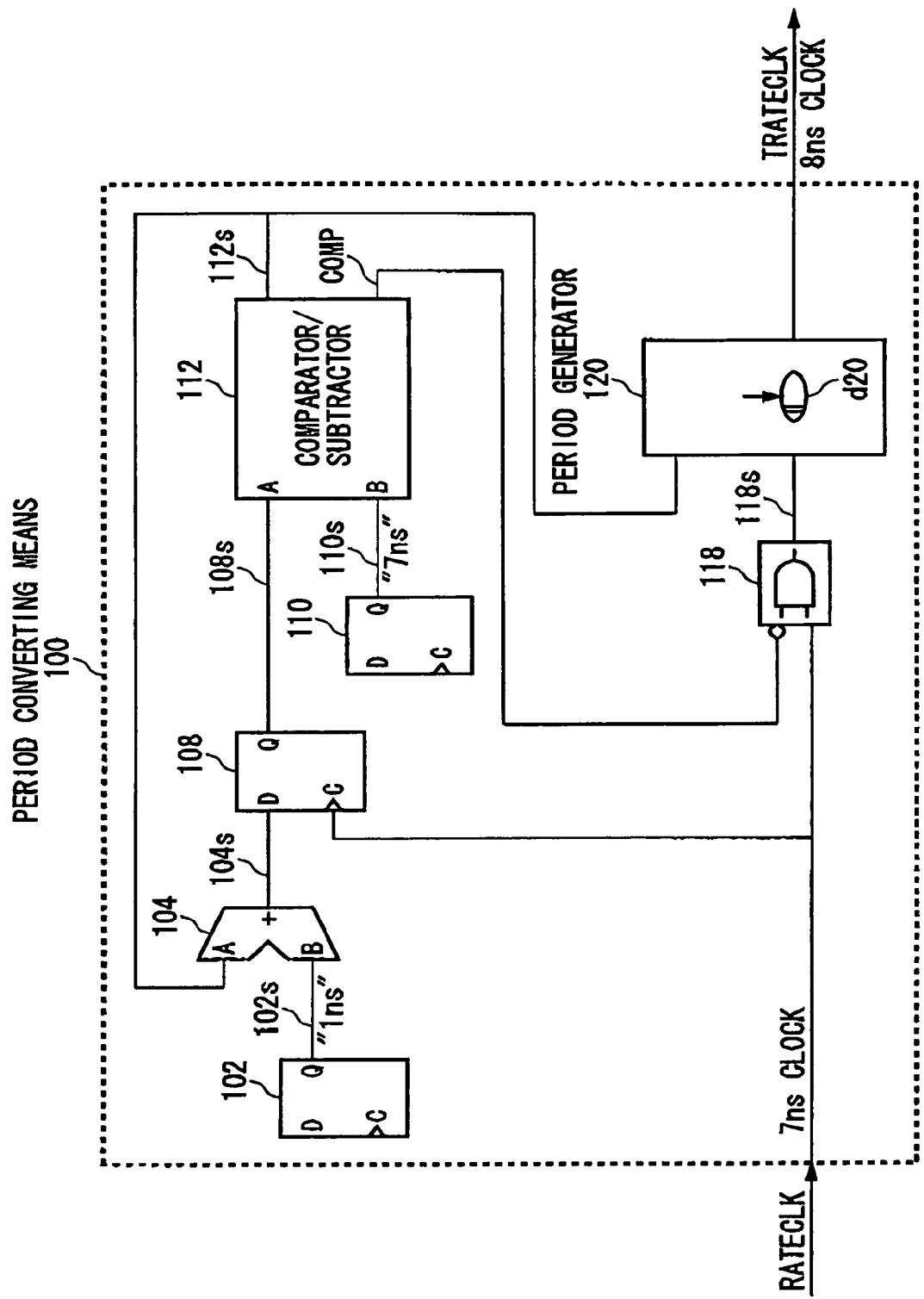
FIG. 8 shows an example of a first internal configuration of the period converting means of this invention.
Figure 9:
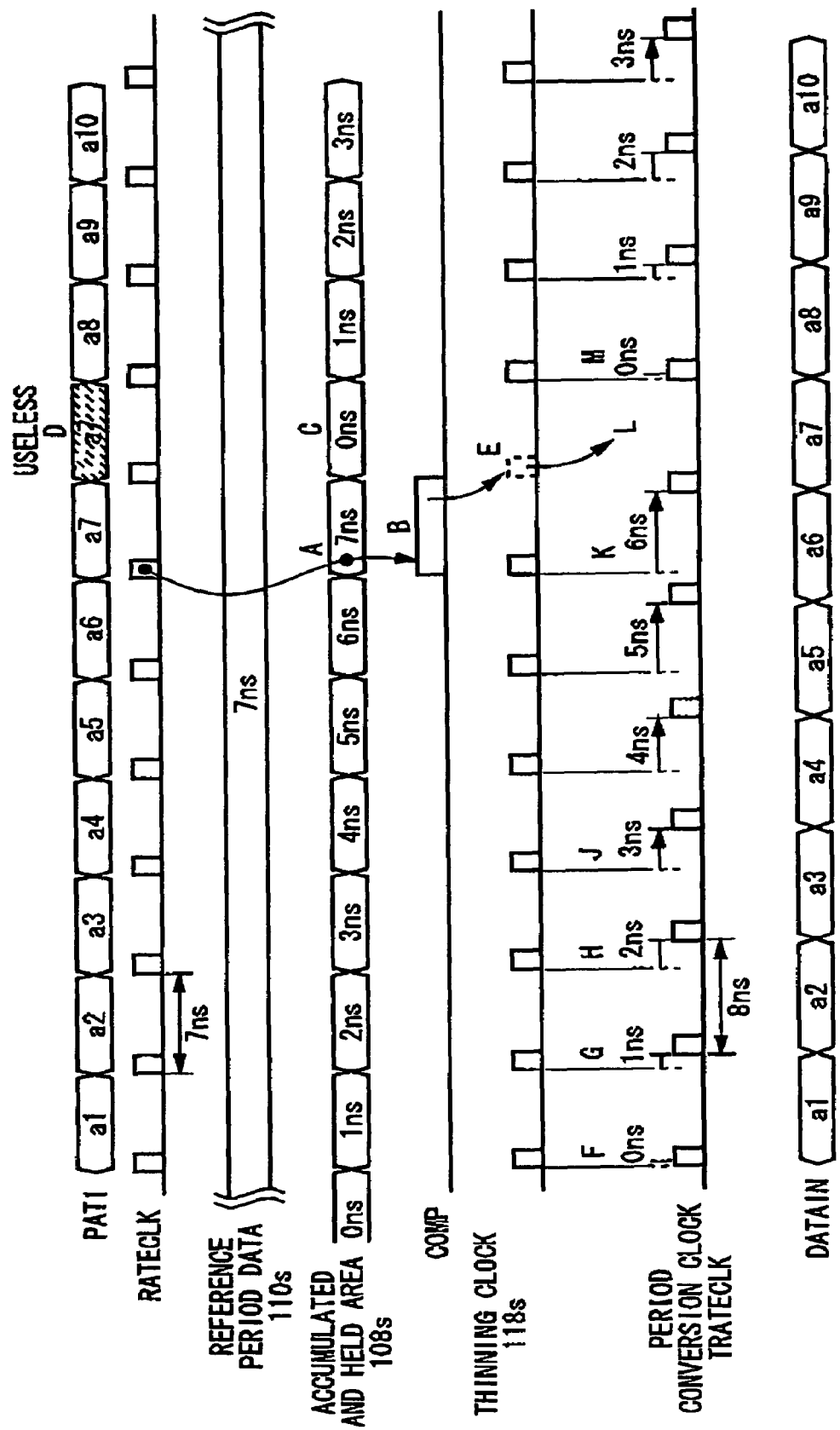
FIG. 9 shows a timing chart depicting an operational example of generating DATAIN in FIG. 3 based on the test pattern in FIG. 10.

FIG. 8 shows an example of a first internal configuration of the period converting means 100. The internal configuration elements include a reference period register 110, a period differential register 102, an adder 104, a flip-flop 108, a comparator/subtractor 112, a clock gate 118, and a period generating unit 120. And the test pattern in FIG. 10 is an example generated with one TS number which is TS1 being applied, and FIG. 9 shows a timing chart depicting an operational example of generating DATAIN in FIG. 3 based on the test pattern in FIG. 10. Description hereafter continues referring to those drawings.

The reference period register 110 is a register for holding reference period data 110s of 7 ns which is the period N.

The period differential register 102 is a register for holding period difference data 112s which is the differential of the period M−the period N. In other words, it holds such value as 8 ns−7 ns=1.0 ns.

The adder 104 which is an adder of two input data receives the period difference data 102s and the period difference data 112 outputted from the comparator/subtractor 112, and outputs accumulated and added data 104s which is the result of adding both of them.

The flip-flop 108 receives the accumulated and added data 104s and outputs accumulated and held data 108s latched by RATECLK. Therefore, the data is sequentially accumulated and added for each RATECLK to be "1 ns", "2 ns", "3 ns", . . . , "7 ns" as shown in FIG. 9. This output is supplied to the comparator/subtractor 112.

The comparator/subtractor 112 which functions as a comparator and subtractor receives the accumulated and held data 108s at its input terminal A and the reference period data 110s at its input terminal B, and outputs the accumulated and held data 108s as the period difference data 102s if A−B<0. Here, A in the operational formula is the data at the input terminal A, and B is the data at the input terminal B. The comparator/subtractor 112 outputs the remainder data left over after the subtraction process of A−B as the period difference data 112s if A−B>=0, and generates and supplies an thinning signal COMP (see B in FIG. 9) to the clock gate 118. Consequently, "7 ns" shown by A in FIG. 9 becomes "7 ns"−"1 ns"="0 ns" in the following cycle shown by C in FIG. 9.

Here, if it is assumed that the value of the period difference data 102s ranges from "1 ns" to "1.01 ns", the remainder data (fraction data) which is "0.01 ns"×the number of cycles is supplied to the adder 104 and the period generating unit 120 in the cycle shown by C in FIG. 9 generated by the thinning signal COMP.

The clock gate 118 supplies RATECLK to the period generating unit 120 as it is in a normal cycle when the thinning signal COMP is in negation. Meanwhile, as shown by B in FIG. 9, in the cycle (thinning cycle) when the thinning signal COMP is in assertion, as shown by E in FIG. 9, RATECLK of the cycle is removed. The thinning clock 118s outputted in this way is supplied to the period generating unit 120. Further, although "a7" of the test pattern PAT1 shown by D in FIG. 9 is not used, the "b8" pattern of DATAOUT side shown in FIG. 10 is required, so it is necessary to insert it for a dummy cycle. Accordingly, the number of average pulses interleaved is converted from the number of pulses of 7 ns into the number of the pulses in response to the period M of 8 ns.

Figure 14:
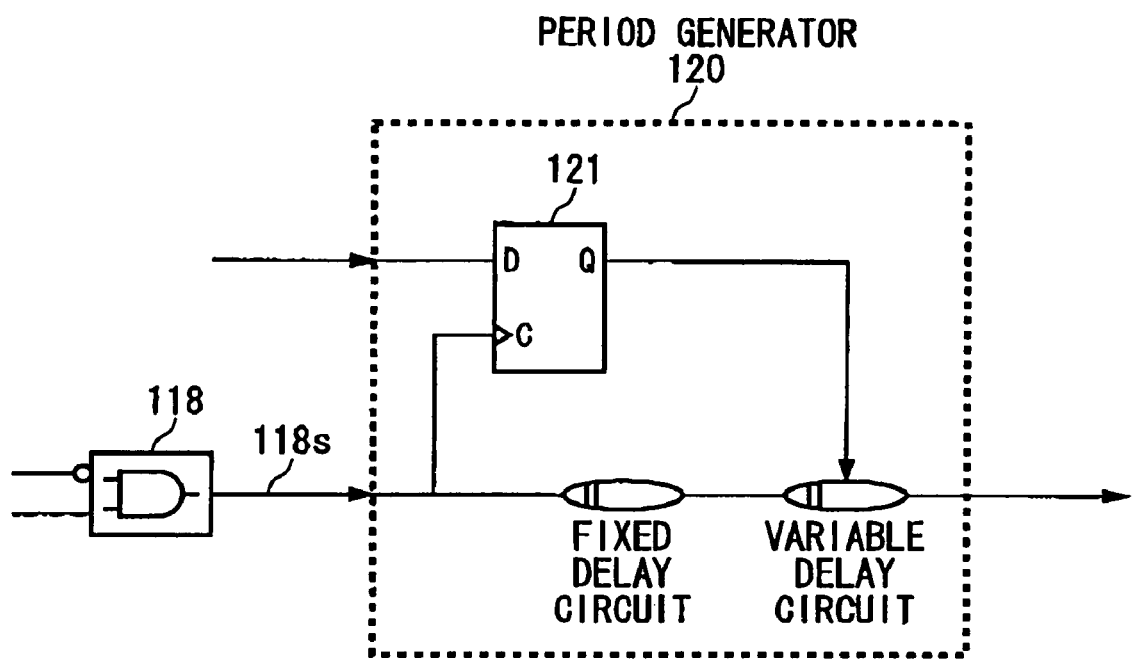
FIG. 14 shows an example of the internal principle configuration of the period converting means.

The period generating unit 120 receives the thinning clock 118s inputted, converts it into a pulse sequence of a uniform period of 8 ns delayed by a predetermined amount and outputs it. In other words, the period generating unit 120 receives the thinning clock 118s inputted and outputs it in order that period conversion clock TRATECLK delayed by a predetermined amount based on the period difference data 112 is as shown by F to M in FIG. 9. That is, it first delays the thinning clock 118s by 0 ns at the position shown by F in FIG. 9, delays the thinning clock 118s by 1 ns at the position shown by G in FIG. 9, by 2 ns at the position shown by H in FIG. 9, by 3 ns at the position shown by J in FIG. 9, continues to sequentially increase the delay amount in the same way, then delay the clock by 6 ns at the position shown by K in FIG. 9, and then outputs no pulse where the thinning clock 118s is not exist in the cycle of the position shown by L in FIG. 9. And from the position shown by M in FIG. 9, the delay process is performed again from 0 ns. As the result of repeating this process, the pulses are converted into the pulse sequence of a uniform period which is the period M of 8 ns. Further, FIG. 14 shows an example of the internal principle configuration of the period generating unit 120 by reference.

According to the configuration in FIG. 8 described above, it is possible to generate the period conversion clock TRATECLK of a period of 8 ns which is different from the period of 7 ns of the test rate by the timing set whose number of usage is one without using timing set numbers TS1 to TS8 which are different for each cycle in the conventional art, whereby the drive pulse DRP or the strobe signal can be generated on the basis of it. Further, the timing set used as many as one is required only if the original offset phase needs to be designated, and if designation is not necessary and other timing sets can be used, the number of usage of the timing set becomes zero.

Accordingly, a considerable advantage to realize a semiconductor tester capable of easily testing a DUT with a plurality of ports whose periods are different without increasing the capacity of the timing set memory TSM provided in the TG is obtained. In addition, a considerable advantage that the range or kinds of DUT products which are applicable can be expanded or increased because a plurality of numbers of TSs are not necessary is obtained.

Figure 11:
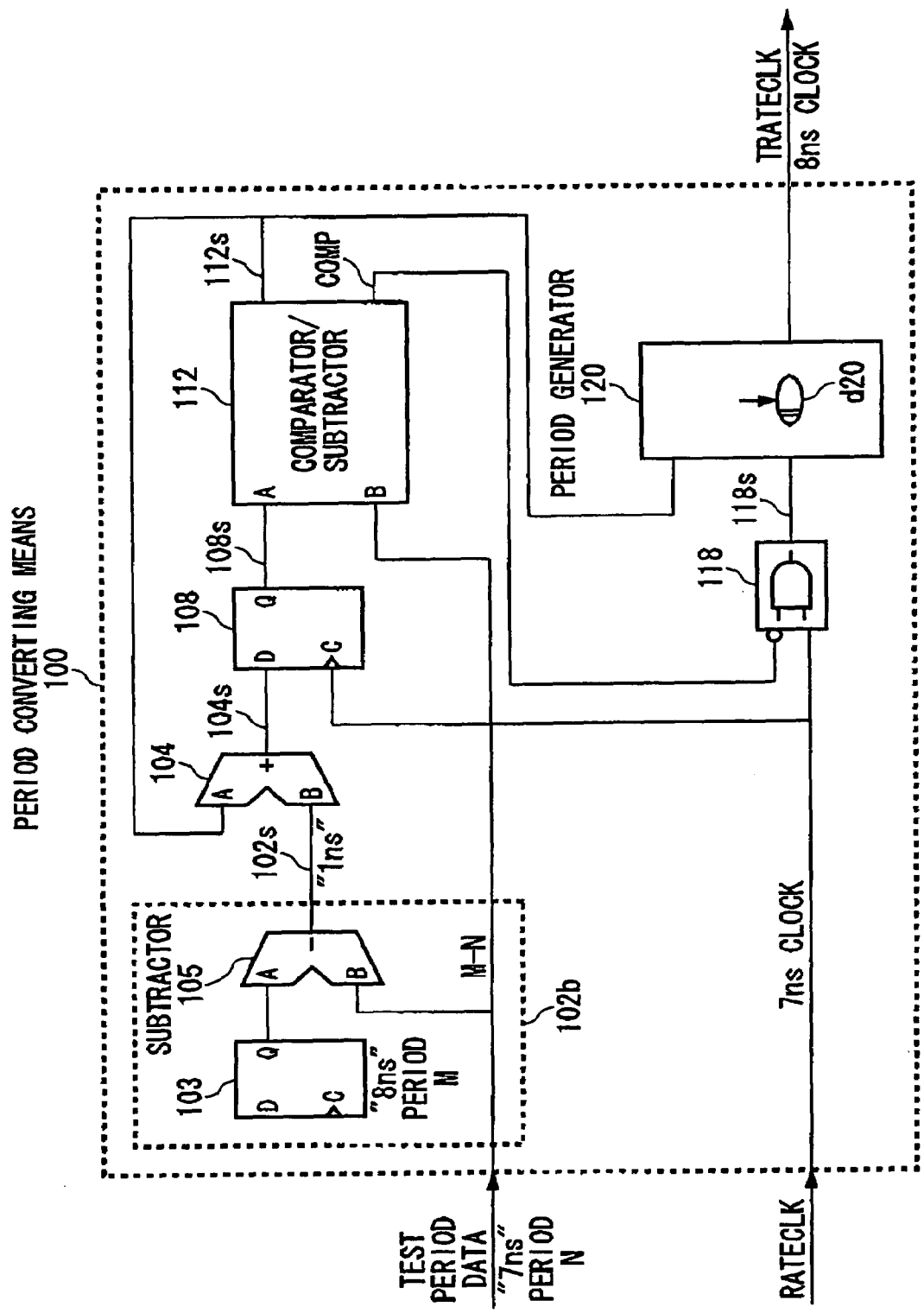
FIG. 11 shows an example of a second internal configuration of the period converting means of this invention.

Next, FIG. 11 shows an example of a second internal configuration of period conversion means 100b which is a modification of the main block configuration in FIG. 8. This is a configuration example to which the setting values of the periods M and N are applied without change.

Figure 1:
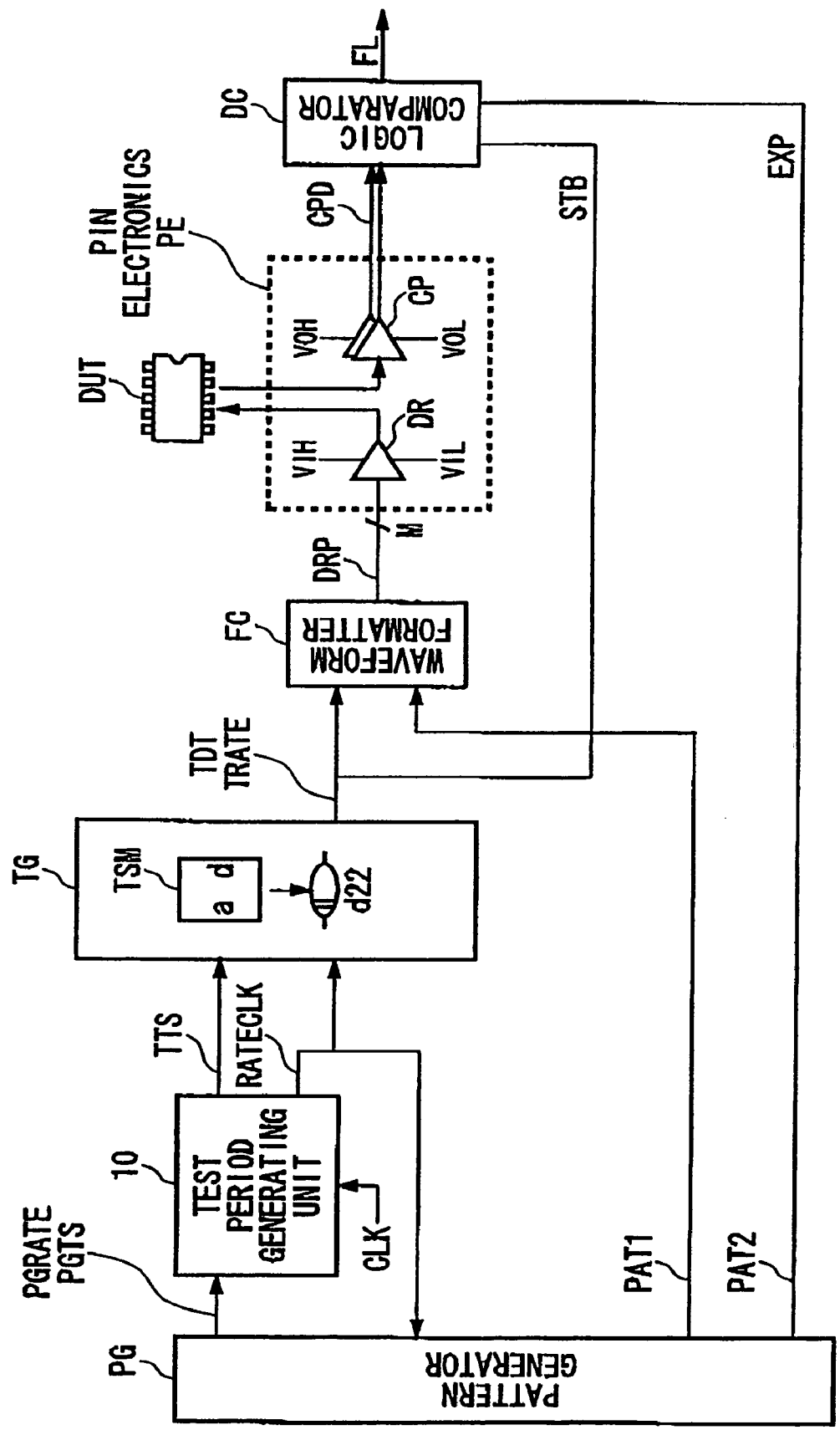
FIG. 1 shows a schematic configuration of a semiconductor tester.
Figure 2:
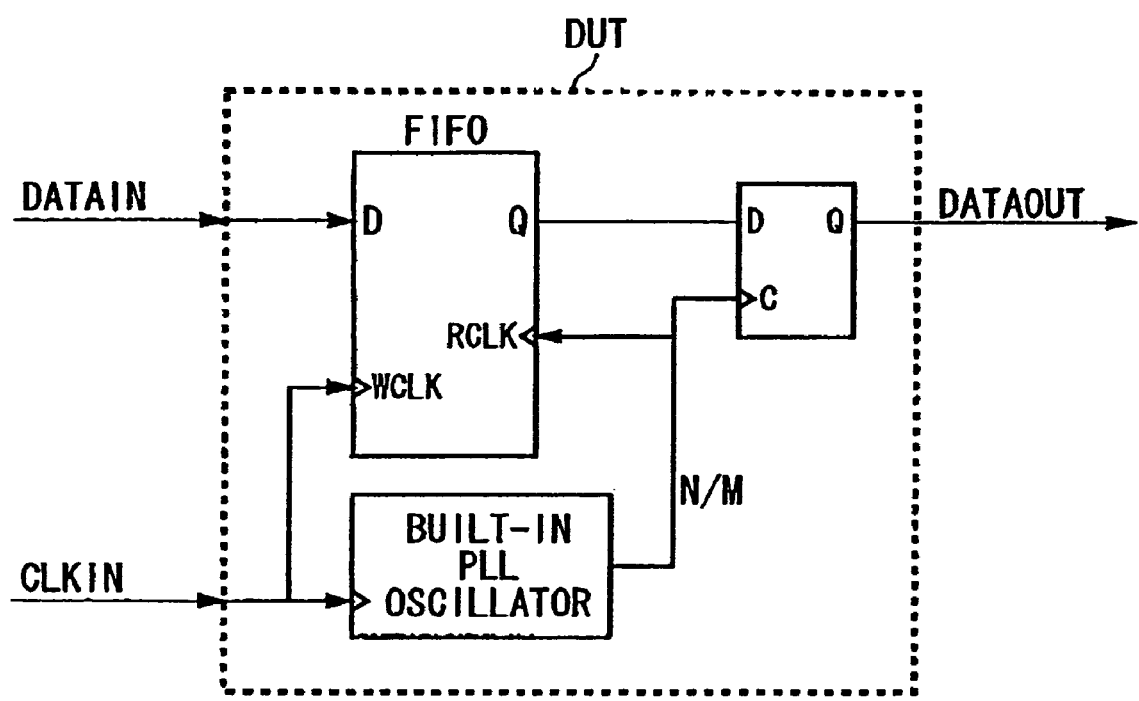
FIG. 2 shows an example of a conventional DUT provided with different two ports (two kinds of periods).

The test period data of "7 ns" which is the test rate of the semiconductor tester is outputted from the test period generating unit 10 shown in FIG. 1, and this is received as the period N of "7 ns".

The period differential output means 102b includes a period M register 103 and a subtractor 105. The setting value of the period M register 103 is set as "8 ns" which is the period M. Consequentially, the period difference data 102s which is the output of the period differential output means 102b is outputted in the data of "1 ns" on which the subtraction of M–N has been performed, so the period difference data 102s equally functions as the period differential register 102. Also in this configuration, the same operation as that in FIG. 7 can be realized, so that it is possible to output a predetermined period conversion clock TRATECLK.

Further, the test period data received as an input is the period N which is the test rate. Since the period N which is the test rate of the semiconductor apparatus can be changed by the on-the-fly, an advantage that it is possible to generate the different period M in the form of synchronously accompanying the dynamic change of the test rate is obtained.

Figure 12:
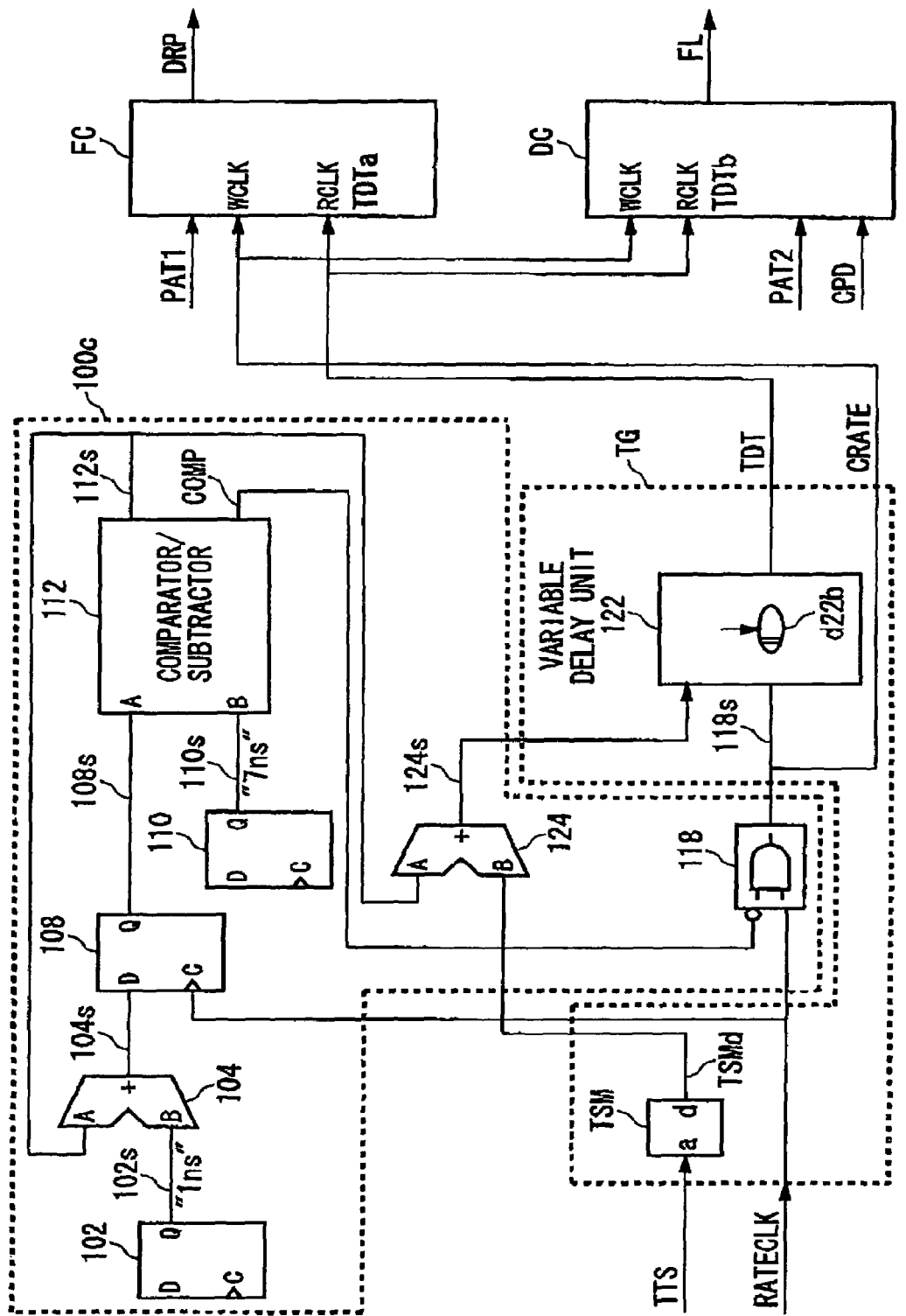
FIG. 12 shows an example of a third internal configuration of the period converting means of this invention.
Figure 13:
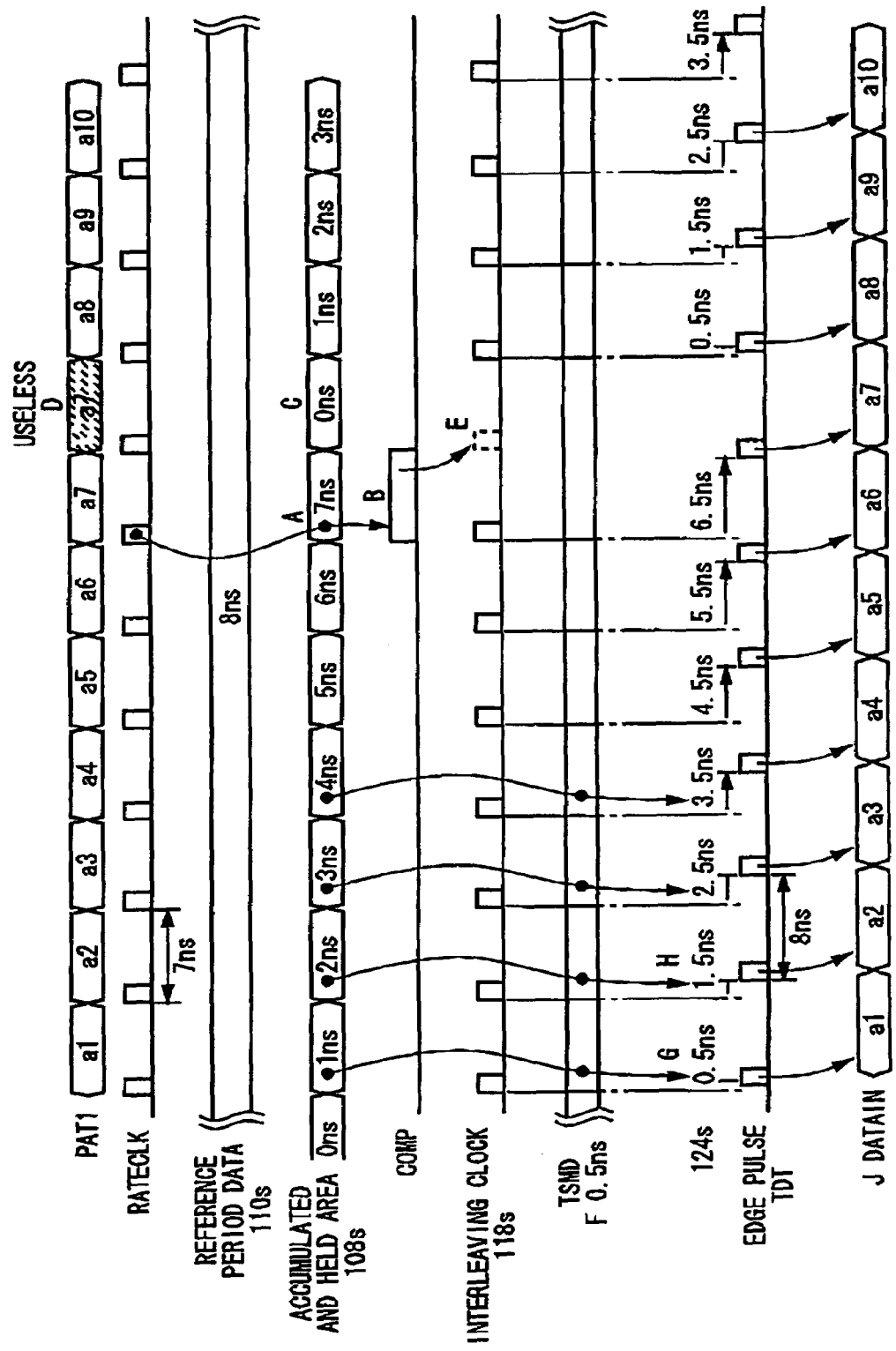
FIG. 13 shows a timing chart depicting the operational in FIG. 12.

Next, FIG. 12 shows an example of a third internal configuration of period conversion means 100c, which is a modified example of the main block configuration in FIG. 8. FIG. 13 shows a flowchart depicting the operation of the configuration example in FIG. 12. Here, TS delay data TSMd of the timing set in FIG. 13 is assumed to be constant as "0.5 ns".

In this configuration example, the variable delay means d20 built in the period generating unit 120 shown in FIG. 8 is removed and unified to the variable delay unit 122 of the TG side as one piece, an adder 124 is further provided in the period conversion means 100c, and the edge pulse TDT given the delay amount of the timing set is generated with the period of 8 ns from the output terminal of TG.

The timing set memory TSM shown in FIG. 12 receives the timing set signal TTS from the test period generating unit 10 and supplies the TS delay data TSMd (see F in FIG. 13) of "0.5 ns" which is the result of retrieving the delay information based on the timing set signal TTS to the input terminal B of the adder 124.

The adder 124 receives the period difference data 112s at the input terminal A, and supplies the edge pulse delay data 124s which is the result of adding both the delay data to the variable delay unit 122.

When the variable delay unit 122 receives the thinning clock 118s, it generates the edge pulse TDT (see G and H in FIG. 13) delayed by the delay amount in response to the edge pulse delay data 124s by the variable delay means d22b. Consequently, DATAIN waveform (see J in FIG. 13) converted with the period of 8 ns which is to be applied to the DUT can be supplied via FC. Further, the internal configuration of the variable delay unit 122 is also the same as that of the internal principle configuration example in FIG. 14.

According to the configuration example in FIG. 12 described above, since the two of variable delay means d20 and d22 can be got together into one piece, a considerable advantage that they can be configured at lower cost is obtained.

Further, although the present invention has been described by way of exemplary embodiments, it should be understood that those skilled in the art might make many changes and substitutions without departing from the spirit and the scope of the present invention, which is defined only by the appended claims.

For example, although the DUT of this embodiment has been exemplified by a simple configuration where it is two that is the number of the boards requiring different periods, an advantage that even with regard to many different periods over 3 this invention can be embodied without consuming many TSs used and besides the applicable range of the DUT being complicated can be expanded is obtained in this invention.

This invention performs the effects present below from the above description.

As obvious from the description above, according to the present invention, it is possible to easily generate the period conversion clock TRATECLK whose period is different from the test period (test rate) of the semiconductor tester with a timing set whose number of usage is one without using the timing sets which are different for each cycle like the conventional art. Accordingly, a considerable advantage that it is possible to easily test a DUT that includes a plurality of boards whose periods are different without increasing the capacity of the timing memory is obtained.

Therefore, the technical effects as well as the economical effects on industries of this invention are significant.

What is claimed is:

1. A semiconductor tester required to generate a timing edge pulse of a different period M different from a period N which is a test period (test rate) of said semiconductor tester, comprising:

period converting means capable of generating said timing edge pulse whose different period M is different from said period N of said test rate without applying a plurality of timing sets provided in said semiconductor tester, wherein said period conversion means comprises:

period difference accumulating means for generating data under different period which results from accumulatively adding a period difference between said period N of said test rate and said different period M (M–N); and different period clock converting means for outputting a period conversion clock which results from receiving said rate clock of said period N and converting said rate clock into said different period M by applying a delay amount in response to said data under different period.

2. A semiconductor tester required to generate a timing edge pulse of a different period M different from a period N which is a test period (test rate) of said semiconductor tester, comprising:

period converting means capable of generating said timing edge pulse whose different period M is different from said period N of said test rate without applying a plurality of timing sets provided in said semiconductor tester, wherein when a timing generator TG of said tester channel comprises a timing set memory TSM and variable delay means therein, said period conversion means comprises:

period difference accumulating means for generating data under different period by accumulatively adding a period difference between said period N of said test rate and said different period M (M–N);

TS adding means for outputting addition delay data which results from receiving TS delay data retrieved by selecting a TS number based on said timing set signal outputted from said tuning set memory TSM and data under different period and adding said TS delay data and data under different period; and thinning means for outputting an thinning clock where a clock of a cycle is removed when said data under different period, which results from receiving and accumulatively adding a rate clock of said period N, matches with said different period M, and said variable delay means generates an edge pulse which results from delaying said thinning clock by a predetermined amount based on said addition delay data, outputs said edge pulse from said TG, and supplies said edge pulse a waveform formatter FC provided on a next stage of said TG.

3. A semiconductor tester provided with a plurality of timing sets capable of giving a predetermined delay amount for each tester channel with reference timing being taken as a base point, where a test period of said semiconductor tester is taken as said reference timing, and configured to generate a timing edge pulse delayed by a predetermined amount based on said timing sets, comprising:

period converting means capable of generating a timing edge pulse whose different period M is different from a period N which is a test rate of said semiconductor tester without applying said plurality of timing sets with regard to a tester channel for generation of said timing edge pulse, wherein said period conversion means comprises:

period difference accumulating means for generating data under different period which results from accumulatively adding a period difference between said period N of said test rate and said different period M (M−N); and different period clock converting means for outputting a period conversion clock which results from receiving said rate clock of said period N and converting said rate clock into said different period M by applying a delay amount in response to said data under different period.

4. A semiconductor tester provided with a plurality of timing sets capable of giving a predetermined delay amount for each tester channel with reference timing being taken as a base point, where a test period of said semiconductor tester is taken as said reference timing, and configured to generate a timing edge pulse delayed by a predetermined amount based on said timing sets, comprising:

period converting means capable of generating a timing edge pulse whose different period M is different from a period N which is a test rate of said semiconductor tester without applying said plurality of timing sets with regard to a tester channel for generation of said timing edge pulse wherein when a timing generator TG of said tester channel comprises a timing set memory TSM and variable delay means therein, said period conversion means comprises:

period difference accumulating means for generating data under different period by accumulatively adding a period difference between said period N of said test rate and said different period M M−N);

TS adding means for outputting addition delay data which results from receiving TS delay data retrieved by selecting a TS number based on said timing set signal outputted from said timing set memory TSM and data under different period and adding said TS delay data and data under different period; and thinning means for outputting an thinning clock where a clock of a cycle is removed when said data under different period, which results from receiving and accumulatively adding a rate clock of said period N, matches with said different period M, and said variable delay means generates an edge pulse which results from delaying said thinning clock by a predetermined amount based on said addition delay data, outputs said edge pulse from said TG, and supplies said edge pulse a waveform formatter FC provided on a next stage of said TG.

5. A semiconductor tester provided with a plurality of timing sets capable of giving a predetermined delay amount for each tester channel with reference timing being taken as a base point, where a test period of said semiconductor tester is taken as said reference timing, and configured to generate a timing edge pulse delayed by a predetermined amount based on said timing sets, comprising:

different period designating means capable of generating a timing edge pulse whose different period M is different from a period N, which is a test rate of said semiconductor tester, without depending upon a timing set signal to designate a timing set number generated from a pattern generator PG with regard to a tester channel for generation of said timing edge pulse and controlling designation of said different period M to be independent from outside, wherein said period conversion means comprises:

period difference accumulating means for generating data under different period which results from accumulatively adding a period difference between said period N of said test rate and said different period M M−N); and different period clock converting means for outputting a period conversion clock which results from receiving said rate clock of said period N and converting said rate clock into said different period M by applying a delay amount in response to said data under different period.

6. A semiconductor tester provided with a plurality of timing sets capable of giving a predetermined delay amount for each tester channel with reference timing being taken as a base point, where a test period of said semiconductor tester is taken as said reference timing, and configured to generate a timing edge pulse delayed by a predetermined amount based on said timing sets, comprising:

different period designating means capable of generating a timing edge pulse whose different period M is different from a period N, which is a test rate of said semiconductor tester, without depending upon a timing set signal to designate a timing set number generated from a pattern generator PG with regard to a tester channel for generation of said timing edge pulse and controlling designation of said different period M to be independent from outside, wherein when a timing generator TG of said tester channel comprises a timing set memory TSM and variable delay means therein, said period conversion means comprises:

period difference accumulating means for generating data under different period by accumulatively adding a period difference between said period N of said test rate and said different period M M−N);

TS adding means for outputting addition delay data which results from receiving TS delay data retrieved by selecting a TS number based on said timing set signal outputted from said timing set memory TSM and data under different period and adding said TS delay data and data under different period; and thinning means for outputting an thinning clock where a clock of a cycle is removed when said data under different period, which results from receiving and accumulatively adding a rate clock of said period N, matches with said different period M, and said variable delay means generates an edge pulse which results from delaying said thinning clock by a predetermined amount based on said addition delay data, outputs said edge pulse from said TG, and supplies said edge pulse a waveform formatter FC provided on a next stage of said TG.

* * * * *

UNITED STATES PATENT AND TRADEMARK OFFICE
CERTIFICATE OF CORRECTION

| | | |
|---|---|---|
| PATENT NO. | : 7,015,685 B2 | Page 1 of 1 |
| APPLICATION NO. | : 10/850050 | |
| DATED | : March 21, 2006 | |
| INVENTOR(S) | : Hiroyasu Nakayama | |

It is certified that error appears in the above-identified patent and that said Letters Patent is hereby corrected as shown below:

Column 11, line 57, replace "M M-N)" with --M(M-N)--.

Column 12, line 27, replace "M M-N)" with --M(M-N)--.

Column 12, line 57, replace "M M-N)" with --M(M-N)--.

Signed and Sealed this

Fourth Day of July, 2006

JON W. DUDAS
*Director of the United States Patent and Trademark Office*